United States Patent
Komatsu

[11] Patent Number: 5,999,572
[45] Date of Patent: Dec. 7, 1999

[54] DIGITAL BROADCASTING RECEIVER TUNER

[75] Inventor: Michihiro Komatsu, Fukushima-ken, Japan

[73] Assignee: ALPS Electric Co., Ltd., Japan

[21] Appl. No.: 08/905,746

[22] Filed: Aug. 4, 1997

[30] Foreign Application Priority Data

Aug. 9, 1996 [JP] Japan .................................. 8-211112

[51] Int. Cl.[6] .............................. H03K 9/00; H04L 27/06
[52] U.S. Cl. ............................................ 375/316; 455/327
[58] Field of Search ..................................... 375/316, 324, 375/327; 455/327, 328, 330; 329/316, 320

[56] References Cited

U.S. PATENT DOCUMENTS

| | | | |
|---|---|---|---|
| 4,520,507 | 5/1985 | Moon | 455/3 |
| 4,534,062 | 8/1985 | Levinson | 455/330 |
| 4,580,290 | 4/1986 | Ushida | 455/319 |
| 4,713,808 | 12/1987 | Gaskill et al. | 370/94 |
| 5,060,299 | 10/1991 | Enderson | 455/326 |
| 5,212,835 | 5/1993 | Suzuki | 455/330 |
| 5,760,632 | 6/1998 | Kawakami et al. | 327/355 |

*Primary Examiner*—Stephen Chin
*Assistant Examiner*—Mohammad Ghayour
*Attorney, Agent, or Firm*—Brinks Hofer Gilson & Lione

[57] ABSTRACT

A digital broadcasting receiver tuner that demodulates excellently a digital signal by substantially reducing a second local oscillation signal that strays from a second frequency conversion stage to a first frequency conversion stage. The digital broadcasting receiver tuner comprises the first frequency conversion stage for frequency converting a received signal into a first intermediate frequency signal higher than the upper frequency limit the received signal, a first intermediate frequency filter for extracting the first intermediate frequency signal, the second frequency conversion stage for frequency converting the extracted first intermediate frequency signal into a second intermediate frequency signal having a predetermined band included in a frequency range extending from 0 to 30 MHz, a second intermediate frequency filter for extracting the second intermediate frequency signal, and a demodulation stage for demodulating the extracted second intermediate frequency signal, wherein the second frequency conversion stage comprises a frequency mixer of high isolation characteristics.

4 Claims, 4 Drawing Sheets

DIGITAL BROADCASTING RECEIVER TUNER

BACKGROUND OF THE INVENTION

1. Field of the Invention

The present invention relates to a digital broadcasting receiver tuner, and more particularly, to a double-conversion type digital broadcasting receiver tuner that is dedicated to receiving digital television broadcast, and performs high-performance digital demodulation with a reduced error rate.

2. Description of the Related Art

With advances in multi-media-related technology, analog broadcasting that uses analog signals as baseband signals is rapidly going to be replaced with digital broadcasting employing digital signals in the field of television broadcasting including ground television broadcasting, CATV (community antenna television) broadcasting, BSTV (broadcasting satellite television) broadcasting and the like.

In the television broadcasting, digital broadcasting is different from analog broadcasting not only in the signal format of the baseband signals but also in type of modulation. For example, digital broadcasting employs QPSK modulation or QAM modulation. For this reason, the television tuner for receiving both digital broadcast signal and analogy broadcast signal contains an analog signal demodulator circuit and a digital signal demodulator circuit to demodulate both the received analogy signal and digital signal, and the television tuner is thus a double-conversion television tuner.

FIG. 5 is a block diagram of an example of such a digital broadcasting receiver tuner, which is already disclosed in Japanese Patent Application No. 7-246323 filed by the applicant of this invention.

As shown in FIG. 5, a digital broadcasting receiver tuner 51 comprises an antenna input node 52, a wideband bandpass filter 53, a first frequency conversion stage 54, a second frequency conversion stage 55, a distributor 56, an analog signal demodulator 57, a digital signal demodulator 58, an analog signal output node 59, a digital signal output node 60 and a selector 61.

The first frequency conversion stage 54 comprises a first frequency mixer 62, a first local oscillator 63, a first phase-locked loop (PLL) 64 and a first intermediate frequency signal selecting bandpass filter 65, and the second frequency conversion stage 55 comprises a second frequency mixer 66, a second local oscillator 67, a second phase-locked loop (PLL) 68, and a second intermediate frequency selecting lowpass filter 69.

In the first frequency conversion stage 54, the first frequency mixer 62 is configured with its first input node connected to the antenna input node 52 via the wideband bandpass filter 53, with its second input node connected to an output node of the first local oscillator 63, and with its output node connected to a first input node of the second frequency mixer 66 in the second frequency conversion stage 55 via the bandpass filter 65. The first phase-locked loop 64 is configured with its input node connected to an output node of the first local oscillator 63, with its output node connected to a control input node of the first local oscillator 63, and with its control input node connected to an output node of the selector 61.

In the second frequency conversion stage 55, the second frequency mixer 66 is configured with its second input node connected to an output node of the second local oscillator 67 and with its output node connected to an input node of the distributor 56 via the second intermediate frequency selecting lowpass filter 69. The second phase-locked loop 68 is configured with its input node connected to an output node of the second local oscillator 67, with its output node connected to a control input node of the second local oscillator 67, and with its control input node connected to an output node of the selector 61. The analog signal demodulator 57 is configured with its input node connected to a first output node of the distributor 56 and with its output node connected to the analog signal output node 59.

The digital signal demodulator 58 is configured with its input node connected to a second output node of the distributor 56 and with its output node connected to the digital signal output node 60. In response to the control signal supplied by the second phase-locked loop 68, the second local oscillator 67 is switched so that it produces a second local oscillation signal at a first frequency when the baseband signal of the selected received signal is an analog signal, and so that it produces a second local oscillation signal of at a second frequency higher than the first frequency when the baseband signal of the selected received signal is a digital signal.

The digital broadcasting receiver tuner 51 generally operates as follows.

By operating the selector 61, a desired television broadcast signal is selected, and the baseband signal format of the selected broadcast signal is also selected. In the first frequency conversion stage 54, the output voltage of the first phase-locked loop 64 is changed in response to the selected broadcast signal, and the output voltage is used to control the frequency of the first local oscillation signal from the frequency-controlled, first local oscillator 63. In the second frequency conversion stage 55, the output voltage of the second phase-locked loop 68 is adjusted in response to the selected signal format, and the output voltage of the second phase-locked loop 68 is used to control the frequency of the second local oscillation signal from the frequency-controlled, second local oscillator 67, wherein the frequency of the second local oscillation signal is controlled to a first frequency when the baseband signal format of the selected broadcast signal is an analog signal, and is controlled to a second frequency higher than the first frequency when the baseband signal format of the selected broadcast signal is a digital signal.

When the broadcast signal received at an antenna comes into the antenna input node 52, the wideband bandpass filter 53 filters out unwanted components of the received signal, and the filtered signal is supplied to the first frequency conversion stage 54. The first frequency conversion stage 54 frequency-mixes the received signal and the first local oscillation signal, and feeds the resulting frequency mixed output to the first intermediate frequency signal selecting bandpass filter 65. The first intermediate frequency signal selecting bandpass filter 65 extracts the received signal selected by the selector 61 out of the remaining received signals, namely, extracts the received signal of a first intermediate frequency $f_{IF1}$ as a first intermediate frequency signal and then feeds it to the second frequency conversion stage 55.

The second frequency conversion stage 55 frequency-mixes the first intermediate frequency signal and the second local oscillation frequency signal of the first frequency or the second frequency produced by the second local oscillator 67, and feeds the resulting frequency mixed output to the second intermediate frequency selecting lowpass filter 69. The second intermediate frequency selecting lowpass filter 69 extracts frequency-converted signal of the second intermediate frequency $f_{IF2A}$ or $f_{IF2D}$ as the second intermediate frequency signal and feeds it to the distributor 56.

The distributor 56 distributes the supplied second intermediate frequency signal to both the analog signal demodulator 57 and the digital signal demodulator 58. The analog signal demodulator 57 analog demodulates the second intermediate frequency signal when the baseband signal format of the second intermediate frequency signal supplied is an analogy signal, and outputs the demodulated signal at the analog signal output node 59. The digital signal demodulator 58 digital-demodulates the second intermediate frequency signal when the baseband signal format of the second intermediate frequency signal supplied is a digital signal, and outputs the demodulated signal at the digital signal output node 60.

As analog broadcasting today is expected to be rapidly replaced with digital broadcasting in television system, the demand on the television tuner is shifting from a television tuner provided with both an analog signal demodulator circuit and a digital signal demodulator circuit for receiving selectively analog broadcasting and digital broadcasting to a digital television broadcasting receiver tuner provided with a digital signal demodulator circuit only, dedicated to receiving digital broadcasting.

When the digital broadcasting receiver tuner dedicated to receiving digital broadcasting is of such a double conversion type digital broadcasting receiver tuner as the already described digital broadcasting receiver tuner 51, a unique problem associated with reception of the digital broadcast signal need to be solved.

More particularly, when the second local oscillation signal from the second oscillator is fed to the second frequency mixer in the second frequency conversion stage, the second local oscillation signal may appear at the first intermediate frequency signal input node of the second frequency mixer without being sufficiently attenuated through the second frequency mixer. The second local oscillation signal propagates backward through the bandpass filter, and reaches the first frequency mixer in the first frequency conversion stage where it is mixed with the first local oscillation signal output from the first local oscillator, and thus spurious component having the same frequency as the second intermediate frequency signal from the second frequency mixer is generated. The spurious component strays through the bandpass filter to the second frequency mixer, and as a result, the spurious component may be superimposed onto the second intermediate frequency signal. Furthermore the spurious component may stray through a power supply circuit to the second frequency mixer, and may be superimposed to the second intermediate frequency signal output from the second frequency mixer. The spurious component superimposed is of the same frequency as the second intermediate frequency signal while their phases are different, and thus performance in the demodulation of QPSK or QAM modulated digital signal will be degraded.

Although the above-described digital broadcasting receiver tuner 51 may be easily modified to a receiver tuner dedicated to receiving digital broadcasting by eliminating the analog signal demodulator circuit and its associated circuit, no consideration is given to resolving the unique problem associated with reception of the digital broadcast signal, and thus high performance is not expected in the demodulation of the digital signal.

SUMMARY OF THE INVENTION

Accordingly, it is an object of the present invention to provide a digital broadcasting receiver tuner that demodulates excellently a digital signal by substantially reducing a second local oscillation signal that strays from a second frequency conversion stage to a first frequency conversion stage.

The digital broadcasting receiver tuner of the present invention is a double conversion type digital broadcasting receiver tuner, and comprises a first frequency conversion stage performing an up-conversion and a second frequency conversion stage performing a down-conversion with a first intermediate frequency signal higher than the upper frequency limit of a received frequency and with a second intermediate frequency signal being 30 MHz or below, and the second frequency conversion stage comprises a frequency mixer of high isolation characteristics.

Since the first intermediate frequency signal is higher than the upper frequency limit of the received frequency and the second intermediate frequency is 30 MHz or below, both the frequencies of first and second local oscillation signals fall outside the frequency band of the broadcast signals, the stray effects of the first and second local oscillation signals are reduced, and the frequency mixer of high isolation characteristics used in the second frequency conversion stage ensures that no second local oscillation signal strays practically, and thus the second intermediate frequency signal is digital-demodulated based good demodulation characteristics.

According to one aspect of the present invention, the digital broadcasting receiver tuner comprises a first frequency conversion stage for frequency converting a received signal into a first intermediate frequency signal higher than the upper frequency limit of the received signal, a first intermediate frequency filter for extracting the first intermediate frequency signal, a second frequency conversion stage for frequency converting the extracted first intermediate frequency signal into a second intermediate frequency signal of 30 MHz or below, a second intermediate frequency filter for extracting the second intermediate frequency signal, and a demodulation stage for demodulating the extracted second intermediate frequency signal, wherein the second frequency conversion stage comprises a frequency mixer of high isolation characteristics.

According to another aspect of the present invention, the second intermediate frequency signal has a 6 MHz occupied band distributed over from 0 MHz to 6 MHz.

According to yet another aspect of the present invention, the frequency mixer of high isolation characteristics is a double-balanced frequency mixer employing a field-effect transistor.

According to yet another aspect of the present invention, the frequency mixer of high isolation characteristics comprises transformers respectively at both the input and output of the mixer and four diodes connected in a bridge configuration between the transformers.

According to yet another aspect of the present invention, the frequency mixer of high isolation characteristics comprises a double-gate, field-effect transistor, with one gate of the transistor supplied with the first intermediate frequency signal and with the other gate of the transistor supplied with a local oscillation signal.

According to the present invention, the first intermediate frequency signal is higher than the upper frequency limit of the received frequency and the second intermediate frequency is 30 MHz or below, both the frequencies of first and second local oscillation signals fall outside the frequency band of the broadcast signals, the stray effects the first and second local oscillation signals on the reception of digital broadcasting are substantially reduced, and the frequency mixer of high isolation characteristics used in the second frequency conversion stage ensures that no second local oscillation signal strays practically, and thus the second intermediate frequency signal is digital-demodulated based good demodulation characteristics.

According to the present invention, since the second intermediate frequency signal is set to be 30 MHz or below, it can be digital-demodulated without the need for another frequency conversion, and thus a low-cost digital broadcasting receiver tuner results with its reduced component count and simplified circuit arrangement.

DESCRIPTION OF THE PREFERRED EMBODIMENTS

Figure 1:
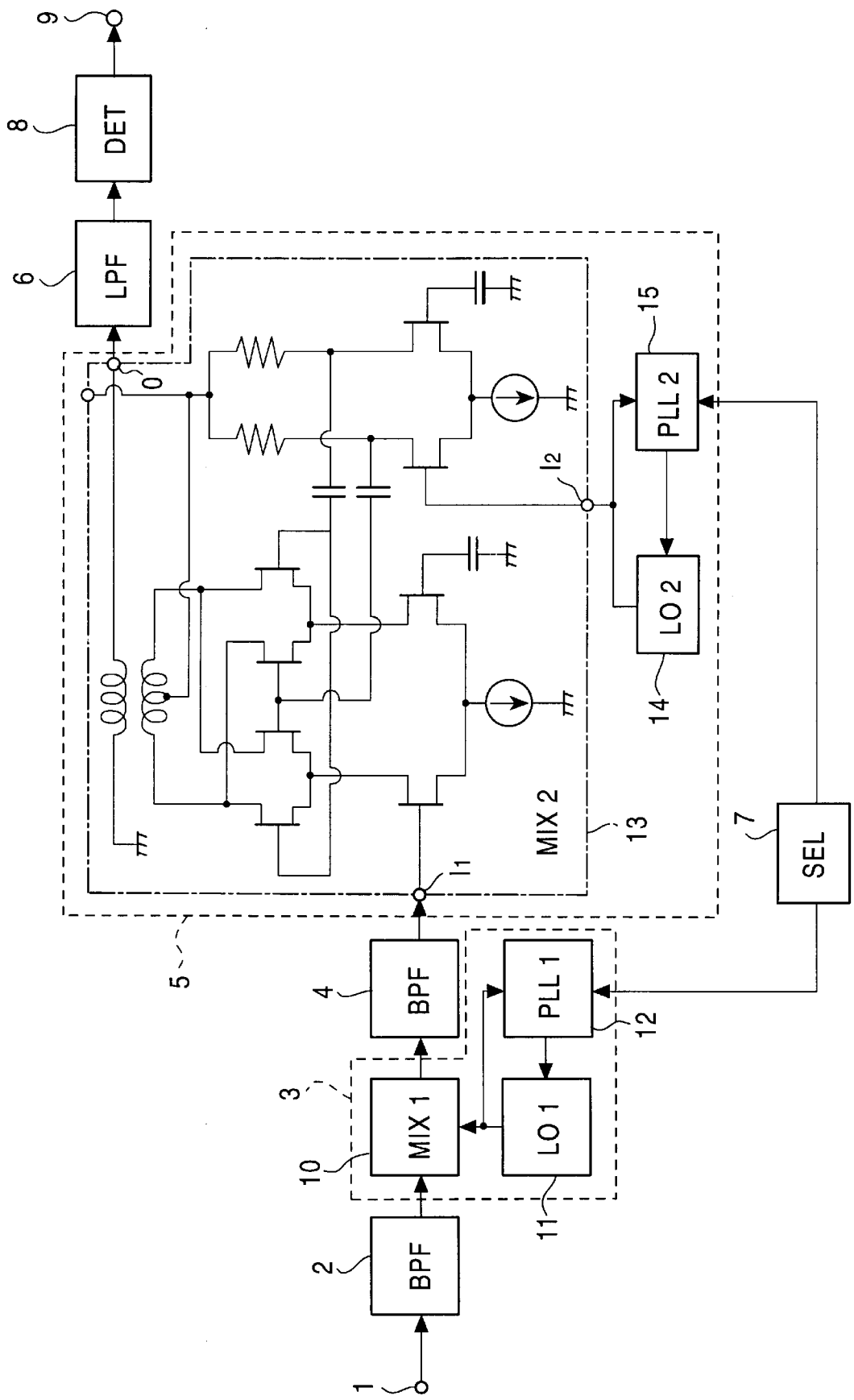
FIG. 1 is a block diagram showing one embodiment of the digital broadcasting receiver tuner of the present invention.

Referring to the drawings, the embodiments of the present invention are now discussed.

FIG. 1 is a block diagram showing one embodiment of a digital broadcasting receiver tuner of the present invention.

As shown in FIG. 1, the digital broadcasting receiver tuner of the present invention comprises an antenna input node 1, a wideband bandpass filter (BPF) 2, a first frequency conversion stage 3, a first intermediate frequency selecting bandpass filter (BPF) 4, a second frequency conversion stage 5, a second intermediate frequency selecting lowpass filter (LPF) 6, a selector 7, a digital signal demodulator (DET) 8, and a demodulated signal output node 9.

The first frequency conversion stage 3 comprises a first frequency mixer (MIX) 10, a first local oscillator (LO1) 11 and a first phase-locked loop (PLL1) 12, and the second frequency conversion stage 5 comprises a second frequency mixer (MIX2) 13, a second local oscillator (LO2) 14 and a second phase-locked loop (PLL2) 15.

In the first frequency conversion stage 3, the first frequency mixer 10 is configured with its first input node connected to the antenna input node 1 via the wideband bandpass filter 2, with its second input node connected to an output node of the first local oscillator 11, and with its output node connected to a first input node $I_1$ of the second frequency mixer 13 in the second frequency conversion stage 5 via the first intermediate frequency selecting bandpass filter 4. The first phase-locked loop 12 is configured with its input node connected to an output node of the first local oscillator 11, with its output node connected to an control input node of the first local oscillator 11, and with its control input node connected to an output node of the selector 7.

In the second frequency conversion stage 5, the second frequency mixer 13 is a double-balanced frequency mixer circuit constructed of a plurality of field-effect transistors as shown in FIG. 1, and is configured with its second input node $I_2$ connected to an output of the second local oscillator 14 and with its output node O connected to an input node of the digital signal demodulator 8 via the second intermediate frequency selecting lowpass filter 6. The second phase-locked loop 15 is configured with its input node connected to an output node of the second local oscillator 14, with its output node connected to a control input node of the second local oscillator 14, and with its control input node connected to an output node of the selector 7.

Figure 2A:
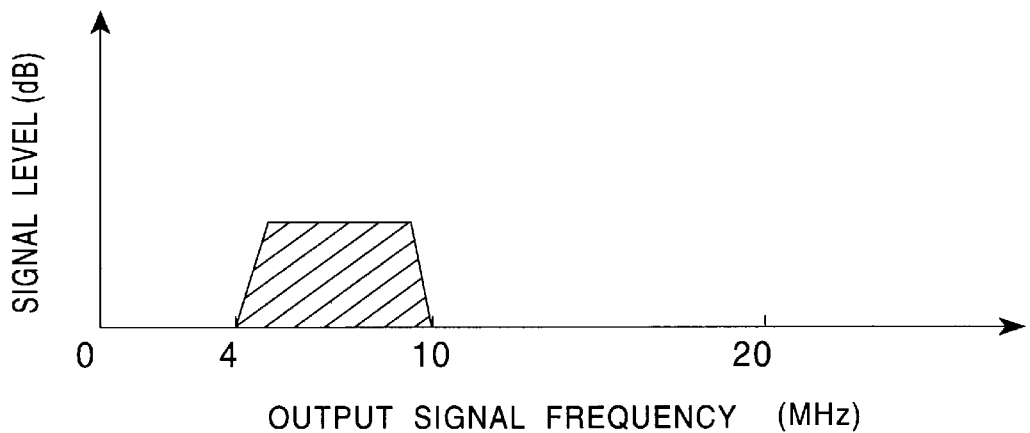
FIGS. 2A and 2B show the frequency spectrum of the band of a second intermediate frequency signal in the digital broadcasting receiver tuner of FIG. 1.
Figure 2B:
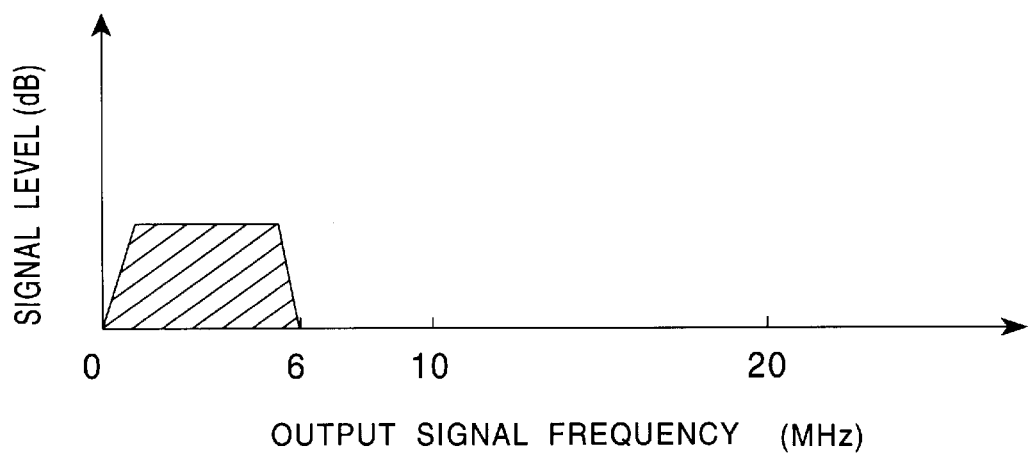

FIGS. 2A and 2B show frequency characteristics in the frequency bands of the second intermediate frequency signal given at the output of the second intermediate frequency selecting lowpass filter 6 in the digital broadcasting receiver tuner of FIG. 1.

Referring also to the frequency characteristics in FIGS. 2A and 2B, the operation of the digital broadcasting receiver tuner thus constructed is now discussed.

When a desired television broadcast signal is selected by operating the selector 7, the output voltage of the first phase-locked loop 12 is changed in response to the selected broadcast signal in the first frequency conversion stage 3, and the output voltage of the first phase-locked loop 12 is used to control the frequency of the first local oscillation signal from the frequency-controlled, first local oscillator 11, and at the same time, in the second frequency conversion stage 5, the output voltage of the second phase-locked loop 15 is used to control the frequency of the second local oscillation signal from the frequency-controlled, second local oscillator 14.

When the broadcast signal received at an antenna (not shown) comes into the antenna input node 1, the wideband bandpass filter 2 filters out unwanted components of the received signal, and the filtered signal is presented to the first frequency mixer 10 in the first frequency conversion stage 3. In the first frequency conversion stage 3, the first frequency mixer 10 performs an up-conversion, by mixing the received signal and the first local oscillation signal produced by the first local oscillator 11, and presents the frequency mixed output which is then supplied to the first intermediate frequency selecting bandpass filter 4. The first intermediate frequency selecting bandpass filter 4 extracts the first intermediate frequency signal only having the first intermediate frequency $f_{IF1}$, corresponding to the one selected by the selector 7 from among the received signals, namely the frequency difference $(f_{LO1}-f_S)$ between the frequency $f_S$ of the received signal and the frequency $f_{LO1}$ of the first local oscillation signal, and the extracted first intermediate frequency signal is presented to the second frequency mixer 13 in the second frequency conversion stage 5. In this case, the first intermediate frequency $f_{IF1}$ is a frequency within a frequency range between 1 GHz and 2 GHz.

In the second frequency conversion stage 5, the second frequency mixer 13 performs a down-conversion, by mixing the first intermediate frequency signal presented to the first input node $I_1$ with the second local oscillation signal produced by the second local oscillator 14, and presents the resulting frequency mixed output to the second intermediate frequency selecting lowpass filter 6. The second intermediate frequency selecting lowpass filter 6 extracts the second intermediate frequency signal only having the second intermediate frequency $f_{IF2}$ equal to the frequency difference $(f_{IF1}-f_{LO2})$ between the first intermediate frequency $f_{IF1}$ and the frequency $f_{LO2}$ of the second local oscillation signal, and the extracted second intermediate frequency signal is presented to the digital signal demodulator 8. In this case, the frequency $f_{LO2}$ of the second local oscillation signal output by the second local oscillator 14 is set to be within 30 MHz of the first intermediate frequency $f_{IF1}$ of the first intermediate frequency signal. Thus, as shown in FIGS. 2A and 2B, the second intermediate frequency $f_{IF2}$, for example, has a frequency band of 6 MHz included in the frequency range extending from 0 MHz to 30 MHz. If the frequency band of the second intermediate frequency signal is set to be distributed over from 0 MHz to 6 MHz as shown in FIG. 2B, digital demodulation of the second intermediate frequency signal will be simplified.

The digital signal demodulator 8 digital-demodulates the second intermediate frequency signal supplied and the resulting analog signal is supplied to the demodulated analog signal output node 9.

In the digital broadcasting receiver tuner of this embodiment, as described above, the first frequency conversion stage 3 performs the up-conversion while the second frequency conversion stage 5 performs the down-conversion, and the second intermediate frequency $f_{IF2}$ having a frequency band of 6 MHz included in a frequency range up to 30 MHz is supplied to the digital signal demodulator 8. Thus, both the frequency $f_{LO1}$ of the first local oscillation signal and the frequency $f_{LO2}$ of the second local oscillation signal fall outside the range of the frequency $f_S$ of the broadcast signal. The stray effects of the first local oscillation signal and second local oscillation signal are thus minimized. Since the second frequency mixer 13 in the second frequency conversion stage 5 is a double-balanced frequency mixer constructed of a plurality of field-effect transistors to result in good isolation characteristics between the first input node $I_1$ and second input node $I_2$, the stray effect of the second local oscillation signal is further reduced.

Since the digital broadcasting receiver tuner of this embodiment minimizes the stray effects of the first local oscillation signal and second local oscillation signal, digital demodulation performance is enhanced, and errors involved in demodulation are substantially reduced.

Since the second intermediate frequency $F_{IF2}$ having a frequency band of 6 MHz included in a frequency range up to 30 MHz is supplied to the digital signal demodulator 8, demodulation of the digital signal is performed without the need for another frequency conversion, and thus a low-cost digital broadcasting receiver tuner results with its reduced component count and simplified circuit arrangement.

Figure 3:
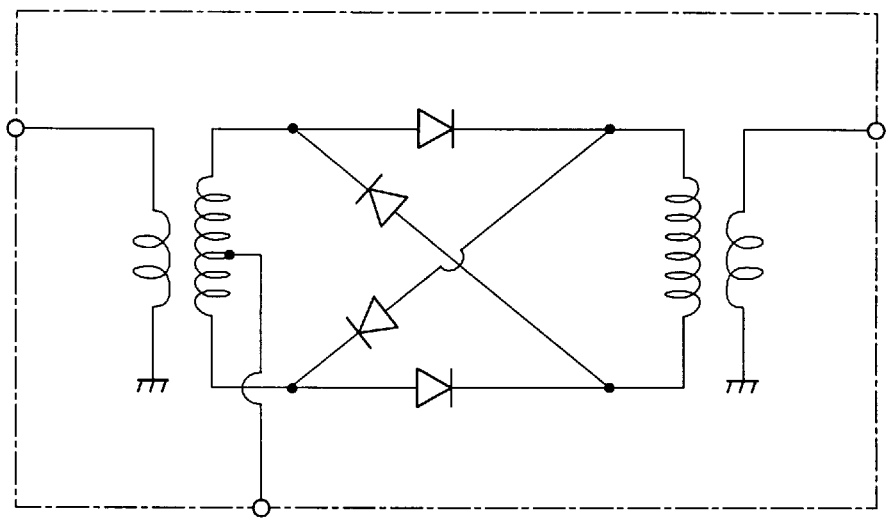
FIG. 3 is a block diagram of another second frequency mixer which may be used in the digital broadcasting receiver tuner of FIG. 1.
Figure 4:
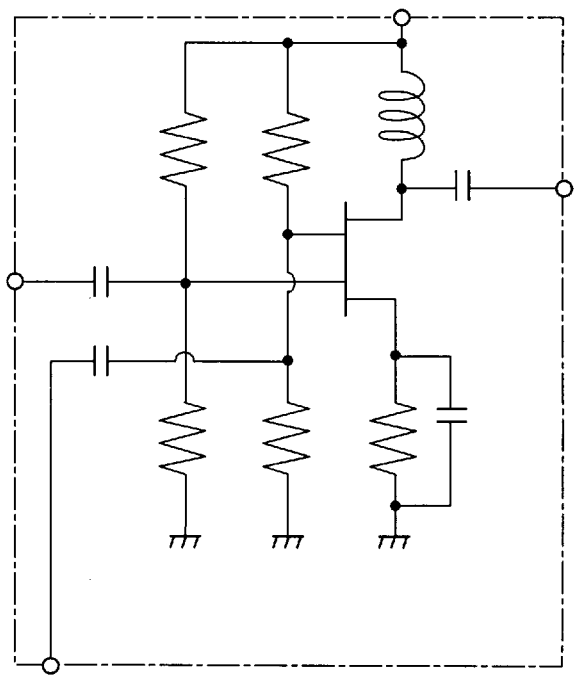
FIG. 4 is a block diagram of yet another second frequency mixer which may be used in the digital broadcasting receiver tuner of FIG. 1.
Figure 5:
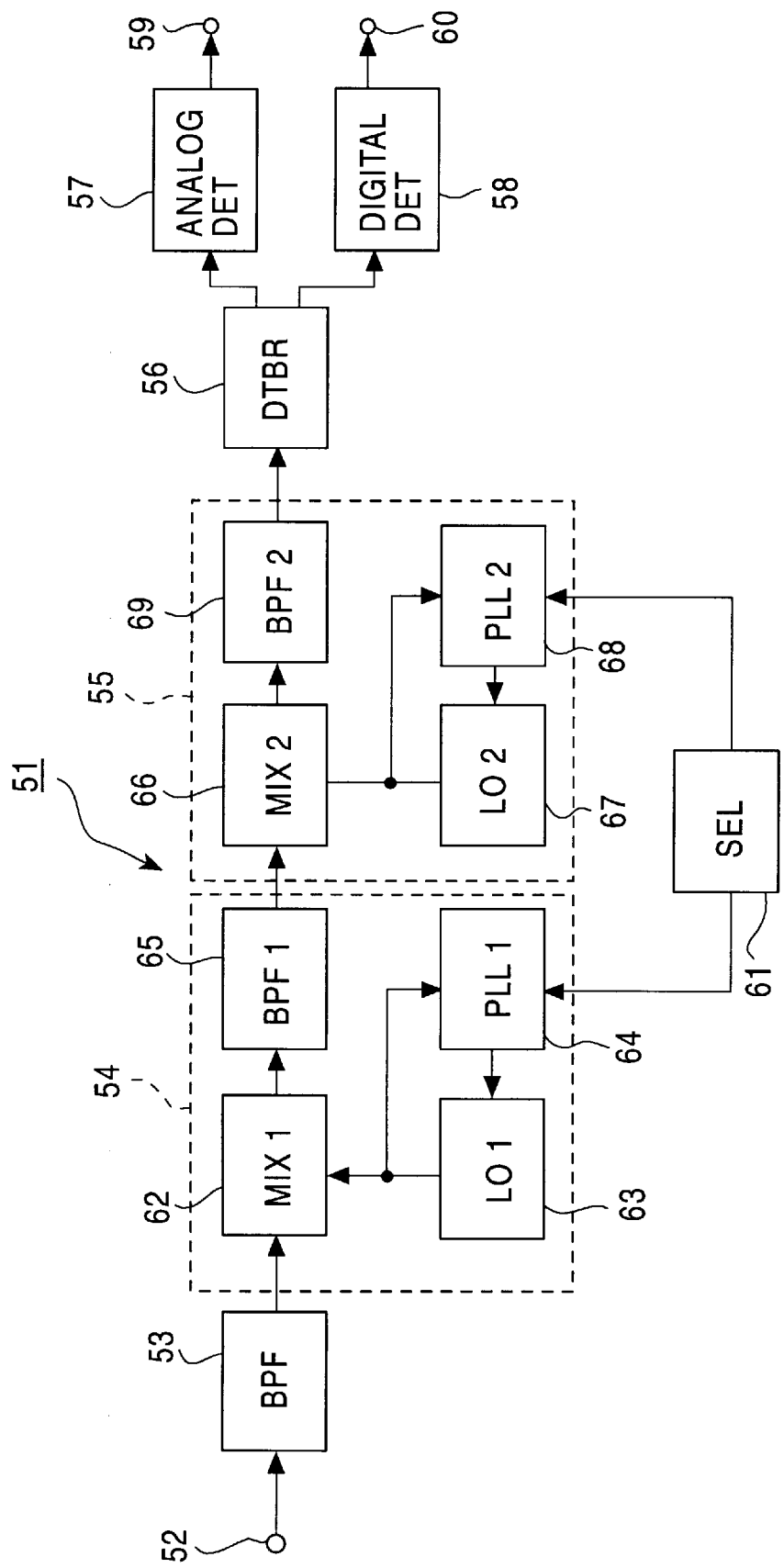
FIG. 5 is a block diagram of a known digital broadcasting receiver tuner.

In the above embodiment, the second frequency mixer 13 in the second frequency conversion stage 5 is a double-balanced frequency mixer constructed of a plurality of field-effect transistors. The second frequency mixer 13 of the present invention is not limited to such a double-balanced frequency mixer circuit. Any type of circuit is acceptable as long as it gives sufficient isolation characteristics between the first input node $I_1$ and second input node $I_2$. For example, one circuit arrangement may be constructed of four diodes that are connected in a bridge configuration between an input transformer and an output transformer as shown in FIG. 3. Another circuit arrangement may be constructed of a double-gated, field-effect transistor with its first gate connected to the first input node $I_1$ and with its second gate connected to the second input node $I_2$. These circuit arrangements offer the same advantage as the preceding embodiment.

According to the present invention, the first frequency conversion performs the up-conversions, the second frequency conversion performs the down-conversion, the second intermediate frequency is 30 MHz or below, both the frequencies of first and second local oscillation signals fall outside the frequency band of the broadcast signals, the effects of stray first and second local oscillation signals are reduced, and the frequency mixer of high isolation characteristics used in the second frequency conversion stage ensures that no second local oscillation signal strays practically, and thus the second intermediate frequency signal is digital-demodulated based good demodulation characteristics.

According to the present invention, since the second intermediate frequency signal is set to be 30 MHz or below, it can be digital-demodulated without the need for another frequency conversion, and thus a low-cost digital broadcasting receiver tuner is provided with its reduced component count and simplified circuit arrangement.

What is claimed is:

1. A digital broadcasting receiver tuner comprising a first frequency conversion stage for frequency converting a received signal into a first intermediate frequency signal higher than the upper frequency limit of the received signal, a first intermediate frequency filter for extracting the first intermediate frequency signal, a second frequency conversion stage for frequency converting the extracted first intermediate frequency signal into a second intermediate frequency signal of 30 MHz or below, a second intermediate frequency filter for extracting the second intermediate frequency signal, and a demodulation stage for demodulating the extracted second intermediate frequency signal, wherein the second frequency conversion stage comprises a frequency mixer of high isolation characteristics wherein the frequency mixer of high isolation characteristics comprises a double-gate, field-effect transistor, with one gate of the transistor supplied with the first intermediate frequency signal and with the other gate of the transistor supplied with a local oscillation signal.

2. A digital broadcasting receiver tuner according to claim 1, wherein the second intermediate frequency signal has a 6 MHz occupied band distributed over from 0 MHz to 6 MHz.

3. A digital broadcasting receiver tuner according to claim 1, wherein the frequency mixer of high isolation characteristics is a double-balanced frequency mixer employing a field-effect transistor.

4. A digital broadcasting receiver tuner according to claim 1, wherein the frequency mixer of high isolation characteristics comprises transformers respectively at both the input and output of the mixer and four diodes connected in a bridge configuration between the transformers.

* * * * *